United States Patent [19]

Baliga et al.

[11] Patent Number: 5,502,307
[45] Date of Patent: Mar. 26, 1996

[54] SPUN CAST IR DETECTOR ARRAYS AND METHOD OF MAKING THE SAME

[75] Inventors: Shankar B. Baliga, Bethage; George Rullman, Dix Hills; Alan P. Doctor, Sea Cliff, all of N.Y.

[73] Assignee: Servo Corporation of America, Hicksville, N.Y.

[21] Appl. No.: 228,960

[22] Filed: Apr. 18, 1994

[51] Int. Cl.$^6$ .................................................. G01J 5/10
[52] U.S. Cl. .................................. 250/338.3; 250/332
[58] Field of Search ........................... 250/338.3, 332

[56] References Cited

U.S. PATENT DOCUMENTS

| | | | |
|---|---|---|---|
| 4,072,863 | 2/1978 | Roundy | 250/338.3 |
| 4,906,849 | 3/1990 | Duo et al. | 250/338.3 |
| 5,030,827 | 7/1991 | Powell | 250/338.3 |
| 5,058,250 | 10/1991 | Turnbull | 250/338.2 |
| 5,099,120 | 3/1992 | Turnbull | 250/338.3 |

*Primary Examiner*—Carolyn E. Fields
*Attorney, Agent, or Firm*—Kane, Dalsimer, Sullivan, Kurucz, Levy, Eisele and Richard

[57] ABSTRACT

A thermal detector is made from a pair of electrodes and a plastic material disposed therebetween which material has a polarization sensitive to IR radiation. Preferably the detector is formed on a substrate with the plastic material being deposited by spin-casting. The material is a copolymer of TrFE and PVDF. The detector may be partitioned into an array of sensors and used in an apparatus wherein the image of an object is projected onto the array and a chopper is used to block the image from the sensors at regular intervals.

10 Claims, 2 Drawing Sheets

SPUN CAST IR DETECTOR ARRAYS AND METHOD OF MAKING THE SAME

BACKGROUND OF THE INVENTION a. Field of Invention

This invention pertains to a IR focal plane array useful in IR imaging applications, and more particularly to arrays formed by spin casting a plastic film onto a wafer.

b. Description of the Prior Art

Accurate and reliable temperature measurements and imaging are performed using solid-state lasers and non-linear optical materials, laser transmitters, detectors and LIDAR subsystems, and infrared detectors.

Photon detectors based on technologies such as lead salts, Schottky barriers and indium antimonide are also currently available. However, these detectors require cryogenic cooling to achieve high detectivities. Furthermore, the quantum nature of the photon absorption implies not only a spectral cutoff wavelength but also a detectivity which is non-uniform with respect to wavelength.

IR thermal detectors based on thermistor bolometers, thermopiles and pyroelectric detectors have been available for several decades. However, these suffer from the drawback of lower speeds in comparison with the photon detectors.

To date, infrared imagery containing focal plane arrays of more than 80,000 "uncooled" detectors sensitive to infrared radiation in the 8 to 14 micron wavelength region have been fabricated and tested. These detectors do not require cryogenic cooling or mechanical scanning, and have demonstrated noise-equivalent temperature difference (NETD) values of 0.1° C. Two different detector technologies, one ferroelectric and the other bolometric, have been used in these focal plane arrays. The uncooled sensor technology has been incorporated into prototype security sensors and weapons sights that can be used as handheld surveillance devices.

However, these detectors have been found to be unsatisfactory. Uncooled focal plane array technologies, based on ferroelectrics, suffer from the requirement of bump-bonding to a silicon readout circuit. Bump-bonding is a technique where the readout electronics of the m*n array and the detector array are two separate entities which are bonded together physically by an interfacing material, typical indium, which is the shape of bumps or mounds on each of the m*n detector pixels and corresponding readout electronics. The detector array and the readout chip are aligned and the bump bonds formed by heat or pressure until the array and readout chips are fused together. The bump-bonding approach is further plagued by producibility problems such as mechanical damage to the detector due to the cold weld process, alignment and surface oxidation. Reticulated lithium tantalate pyroelectric arrays have also been used to fabricate uncooled focal plane arrays but also suffer from the requirement of bump-bonding.

Moreover, the detectors used in bump technology require reticulation of the pixel elements in order to reduce the thermal crosstalk, which otherwise is quite significant and causes deterioration of the modulation transfer function (MTF).

OBJECTIVES AND SUMMARY OF THE INVENTION

In view of the above-mentioned disadvantages of the prior art, an objective of the present invention is to provide a thermal detector which has a very fast response.

Yet another objective is to provide a detector which operates at ambient temperatures without the need of power-hungry heat exchanges, cooling devices or heating devices.

A further objective is to provide a detector array made of a pyroelectric polymer as well as a method of making the same.

Other objectives and advantages of the invention shall become apparent from the following description.

The subject invention pertains to a new high speed, high sensitivity IR detector array capable of room temperature operation. This detector array consists of sensors having a thin plastic pyroelectric film spun-cast onto a metallized silicon wafer.

The detector array is made using a pyroelectric material which is a plastic film spin-cast from solution. The material is a copolymer of polyvinylidene fluoride (PVDF) and trifluoroethylene (TrFE) with the ratios optimized for pyroelectric response. Preferably the ratio of PVDF to TrFE is in the range of 80:20 to 70:30 and more specifically, a ratio of 75:25. Unlike PVDF, the copolymer does not require mechanical stretching to become pyroelectrically active because of the TrFE which forces the material to crystallize in the polar beta form. The detector array is made by first preparing a solution of the copolymer in suspension, spin-casting the copolymer on a substrate to form a copolymer layer, and subsequently annealing and corona poling the layer. The layer has a thickness in the range 0.3 to 3 micron and can be spuncast onto a variety of substrates including silicon, metallized silicon and metallized glass. Wet and dry photolithographic processes are used to partition and delineate the resulting structure into sensors arranged into an m*n array.

Since the pyroelectric detector consists essentially of an active material (the copolymer film) disposed between capacitive electrodes, the spin-cast film can easily be patterned into IR sensors of different shapes and sizes from micron sizes to multi-inch elements limited only by the size of the host wafer and the processing equipment. The polymer layer can be applied very uniformly over the entire wafer and can also be used as large area laser receiver. A wide or selective spectral range of detection is achieved through an absorptive coating deposited over the copolymer layer.

The high-speed of the device comes from the efficient heat sinking of the film by the wafer on which the copolymer is spun and the low thermal mass of the film. The high sensitivity of this pyroelectric film arises from its being extremely thin in the range of 0.5 microns. The responsivity of a pyroelectric detector is inversely proportional to its thickness. The low loss tangent and high current responsivity result in a high sensitivity detector. The speed of response has been tested using high speed lasers and is known to be faster than 20 nanoseconds, the measurement being limited by available electronics. The IR detector presents a high current responsivity in comparison with the other pyroelectrics and is due primarily to the extreme thinness of the pyroelectric material as compared with conventional pyroelectric crystals ($LiTaO_3$) and ceramics (PZT). The film also operates at ambient temperature and is genuinely uncooled, as contrasted to ferroelectric and microbolometric detectors which are usually claimed to be "uncooled" but in fact require temperature stabilization, often accomplished using thermoelectric cooler/heaters which are costly and require large amounts of power for operation.

DETAILED DESCRIPTION OF THE INVENTION

Figure 2:
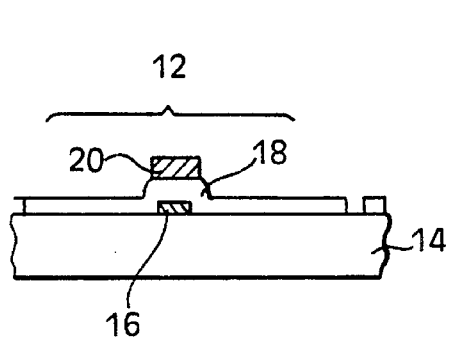
FIG. 2 shows a partial sectional view of the IR detector array of FIG. 1.
Figure 1:
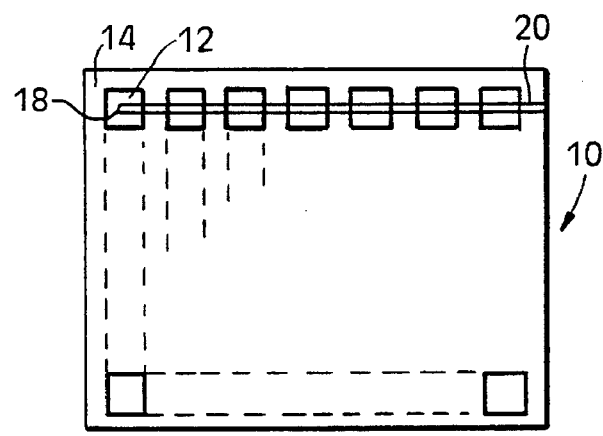
FIG. 1 shows a plane view of an IR detector array constructed in accordance with this invention.

As shown in FIGS. 1 and 2 an IR detector array 10 constructed in accordance with this invention consists of a plurality of IR sensors or pixels 12. In FIG. 1 sensors or pixels 12 are shown disposed in a two dimensional array on a substrate 14. It should be understood that individual sensors 12 may be arranged in any one or two dimensional array or pattern as desired.

Each sensor 12 consists of a bottom electrode 16, a plastic film 18 and a top electrode 20. The electrodes 16 and 20 are connected to a plurality of conductors which have been omitted for the sake of simplicity.

In FIG. 1 film 18 is shown as having a generally square shape however the film may be formed in other shapes as well. Film 18 has a thickness in the order of 0.5–1.5 microns.

The two contacts 16 and 20 and the film 18 therebetween form a capacitive device. Film 18 is preferably made of a plastic material such as copolymers PVDF (polyvinylidene fluoride) with TrFE (trifluorethylene) formed on substrate 14 by spin casting and which material has been activated to form a pyroelectric material which changes its polarization spontaneously in response to IR radiation, thereby changing the capacitance of the sensor 12. Preferably film 18 is composed of 75% PVDF and 25% TrFE. Thus, if an IR image is projected on the array 10 corresponding to the temperature profile of an object, this temperature profile can be sensed by determining the capacitance of the sensors 12.

The array shown in FIGS. 1 and 2 has a number of advantages over the prior art. Because film 18 is deposited in a spin casting layer, its thickness can be controlled very accurately. Therefore the production of sensor arrays is very efficient with a lower number of array chips being rejected. While previous detector arrays had to be temperature controlled, i.e. they had to be maintained at a preselected nominal temperature which often is in the cryogenic range, the present detector array operates at room temperature and does not require any temperature control equipment.

Figure 3:
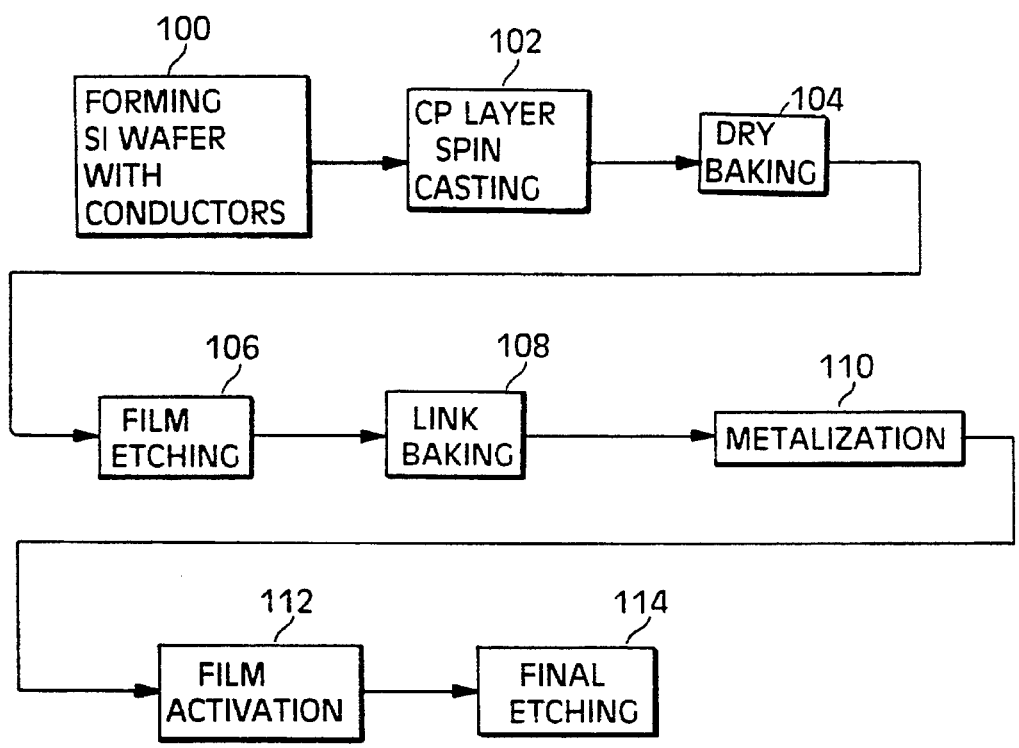
FIG. 3 shows a block diagram of the method used to make the array of FIG. 1.

The method of making the detector array is now described in conjunction with the block diagram of FIG. 3 First, in step 100 substrate 14 is formed with a first pattern of conductors as well as the bottom electrodes 16. This step is performed using well known IC manufacturing techniques. The first pattern of conductors is laid out to provide selective electrical contact from the edge of substrate 14 to each bottom electrode 16.

Next, a layer of a PVDF and TrFE copolymer (CP) dispersed in a solution of (MEK) methyl ethyl retone is deposited on substrate 14 by spin casting (step 102). Once the layer of CP is deposited thereon, the substrate is baked (step 104) in vacuum at about 100° C. to boil off the solvent thereby leaving a dry CP layer.

Next (step 106) the CP layer is etched to partition it thereby forming films 18 for the individual sensors. During etching, portions of the CP layer are removed to separate films 18 by about 0.5 microns. Etching the CP layer insures that the films 18 of the sensors are well isolated from each other thereby reducing thermal cross bleeding. The CP layer is further etched peripherally about the substrate 14 to uncover the conductors connected to the bottom contacts 16. The etching may be performed by using photolithographic techniques.

After the etching is completed, the substrate with films 18 is baked a second time (step 108) at a temperature of about 150° C. selected to cause said copolymers to link or crystalize. Next, in step 110 the substrate and film are metalized by adding a layer of conductive material. Next, in step 112 the film 18 is activated by applying to the substrate assembly a strong electric field in the order of 10 kilovolts, thereby causing the film to polarize in a predetermined direction. Preferably the film is polarized in a direction perpendicular to the substrate.

Finally, in step 114 final etching is performed to remove extra material deposited during the metallization step 112 thereby forming another pattern of conductors arranged to provide selective electrical contact from the edge of substrate 14 to each top electrode 20.

Spin casting the plastic film onto the substrate has proved to be extremely advantageous because it results in a film having a very uniform thickness across the substrate. The thin film provides a detector having an extremely fast response (in the order of sub-nanoseconds), low thermal cross talk, low noise level. The sensors formed between the two contacts and the film has a high capacitance and low impedance resulting in a device having a high signal to noise ratio. Moreover, the resulting uncooled monolithic thermal imaging array does not require any bumps, epoxy, solder or other mechanical attachment means.

The plastic film pixel of the array has the following typical characteristics:

| | |
|---|---|
| Cooling Requirements: | None (completely uncooled operation up to 71° C.) |
| Detection Spectral Response: | 3–5 and/or 8–14 um (Total usable band UV to FAR IR) |
| NETD with f/1 optics: | 0.1° C. |
| NEP: | $1 \times 10^{-10} W/(HZ)^{1/2}$ |
| D*: | $5 \times 10^8$ (For 40 um Pixels) |
| Loss Tangent: | 0.01 |
| Pixel Capacitance: | 0.04 pF |
| Pixel Size: | 47 × 47 um |
| Pixel Pitch: | 50 um centers |
| Fill Factor: | 88% |
| Data Rate: | >1 KHz |
| Frame Rate: | 30 Hz |
| Dynamic Range: | 80 dB |
| Pyroelectric Coefficient (dP/dT) | 4 nC/°C.-cm$^2$ |
| Dielectric Constant: | 7–8 |
| Microphonic Response: | <0.1 uV/g |
| Thermal Crosstalk: | <1% (@ 1 KHz) |
| Electrical Crosstalk: | <5% |

Figure 4:
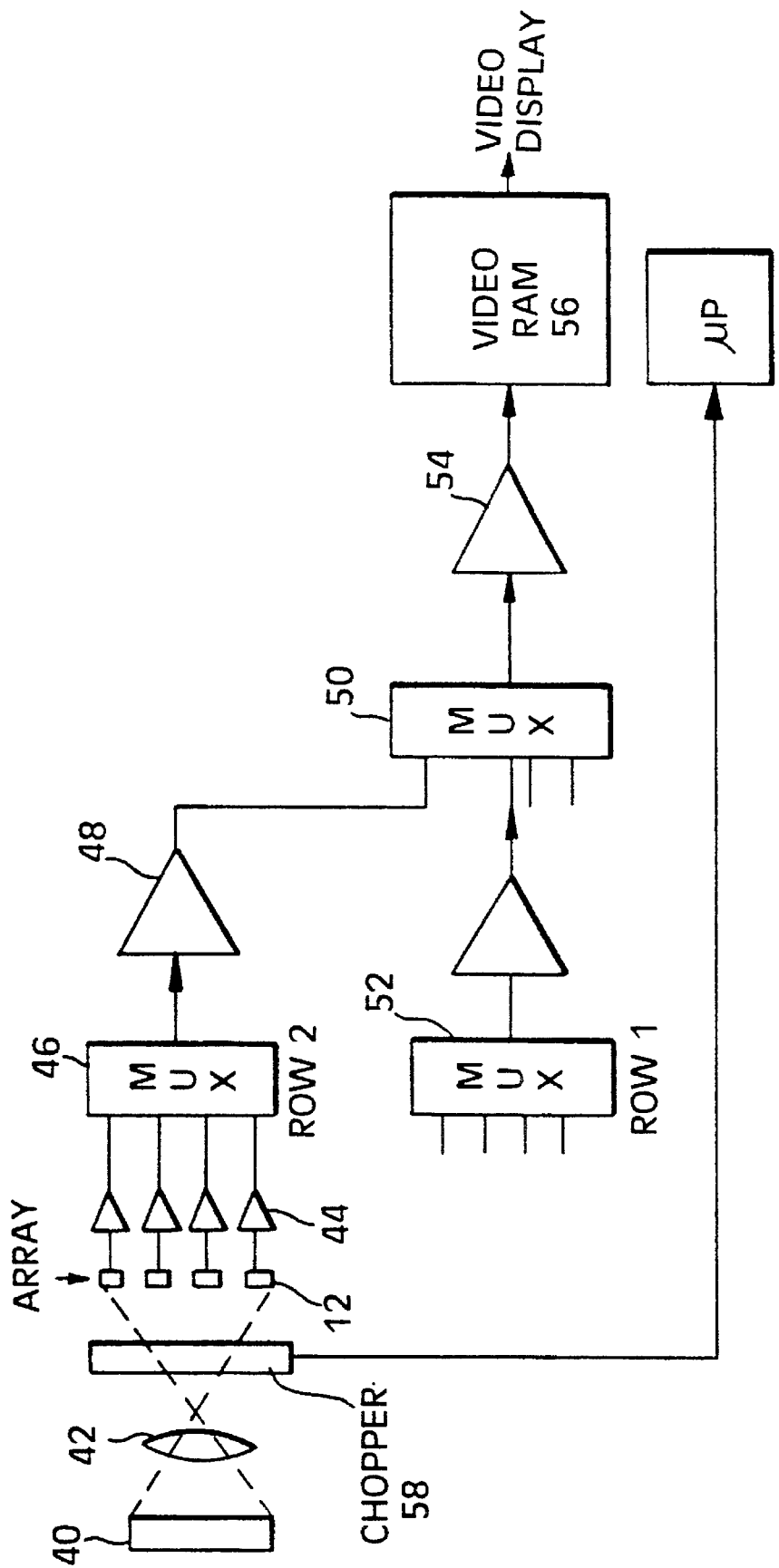
FIG. 4 shows a somewhat schematic illustration of an apparatus incorporating the array of FIGS. 1–3.

An apparatus incorporating the array of FIGS. 1 and 2 is shown in FIG. 4. In this Figure, an object 40 is scanned using thermal array 10 of sensors 12. More particularly a thermal image of object 40 is projected onto array 10 by a lens 42. The output of a first row of sensors 12 is fed through corresponding amplifiers 44 to a multiplexer (MUX) 46. The output of multiplexer 46 after amplification by amplifier 48 is fed to a master multiplexer 50. Multiplexer 50 also receives inputs from multiplexer 52 for a second row of sensors as well as other row multiplexers. The output of multiplexer 50 is amplified by amplifier 54. The output of amplifier 54 may be used as an input to a video display to show a raw thermal image of object 40. However, to obtain a more accurate image it is preferable to feed the output of amplifier (after analog-to-digital conversion) to be stored in a video memory 56. In addition, the image to sensors 12 is blanked or chopped at regular intervals by a chopper 58. This chopper 58 may be mechanical chopper consisting of a rotating blade which sequentially blanks each of the sensors at regular intervals. Alternatively, a grid may be used sized and shaped to cover alternate columns of array 10. Each sensor is then blanked by reciprocating the grid back and forth to cover alternate columns. The chopper 58 may also be constructed as an electronic chopper comprising for example LCD panels which selectively permit the image of object 40 to impinge on array 10. Preferably chopper 58 is operated to limit the exposure of each sensor to about a millisecond. The use of the chopper insures that the array is not saturated and prevents blooming.

The status or position of chopper 58 is provided to a microprocessor 60. For each sensor 12, the microprocessor obtains a differential temperature reading by comparing the output current of the sensor corresponding to an image with the dark current from the sensor, i.e. the current generated when the sensor is blanked. This differential measurement is then stored in video memory 56 to thereby provide a super fine temperature profile for the object 40.

Obviously numerous modifications can be made to this invention without departing from its scope as defined in the appended claims.

We claim:

1. A temperature detector comprising:

a first electrode and second electrode disposed in parallel;

a spuncast pyroelectric polymer film integral with a substrate, said film including portions disposed between said first and second electrodes to form a capacitive device, said first and second electrodes being disposed on a respective top and bottom of said film, said film having a polarization which changes in response to IR radiation impinging on said film.

2. The detector of claim 1 wherein a plurality of sensors are disposed on said substrate in an m*n array, each sensor consisting of said first and second electrodes and said film disposed therebetween.

3. The detector of claim 1 wherein said film is a copolymer.

4. The detector of claim 1 wherein said film is a copolymer of trifluoroethylene and polyvinylidene fluoride.

5. The detector of claim 1 wherein said film is an activated copolymer.

6. A method of making an infrared detector array comprising the steps of:

providing a substrate;

forming an array of first electrodes on said substrate;

spin-casting a layer of plastic material integral with said substrate on said first electrodes, said plastic material having a polarization sensitive to IR radiation;

partitioning said layer into a plurality of film sections, with one film section being superimposed on each of said first electrodes; and thereafter applying an array of second electrodes on said film sections, one of said second electrodes being applied to each of said films opposite to a respective first electrode;

thereby forming an array of sensors, each sensor consisting of one first electrode, one second electrode, and one film disposed between said one first electrode and said one second electrode.

7. The method of claim 6 wherein said plastic material is a copolymer of trifluoroethylene and polyvinylidene fluoride.

8. The method of claim 6 wherein said material is deposited on said first electrodes in a solution, further comprising the step of baking to evaporate the solvent.

9. The method of claim 6 further comprising the step of activating said material.

10. The method of claim 9 wherein said material is activated by applying a static electric field.

* * * * *